United States Patent [19]

Huppenthal et al.

[11] Patent Number: 5,455,530
[45] Date of Patent: Oct. 3, 1995

[54] DUTY CYCLE CONTROL CIRCUIT AND ASSOCIATED METHOD

[75] Inventors: Jon M. Huppenthal; Lee A. Burton, both of Colorado Springs, Colo.

[73] Assignee: Cray Computer Corporation, Colorado Springs, Colo.

[21] Appl. No.: 208,946

[22] Filed: Mar. 9, 1994

[51] Int. Cl.⁶ .................................................. H03K 3/017
[52] U.S. Cl. .............................................. 327/175; 327/176
[58] Field of Search ........................... 307/87, 231, 262, 307/265, 269, 411, 471, 490, 491, 494; 328/155, 133, 55; 341/152; 327/1, 13, 14, 15, 141, 172, 173, 174, 175, 176, 177, 231, 334, 362, 561

[56] References Cited

U.S. PATENT DOCUMENTS

| | | | |
|---|---|---|---|
| 4,535,459 | 8/1985 | Hogge, Jr. | 375/80 |
| 4,612,459 | 9/1986 | Pollachek | 307/468 |
| 4,788,605 | 11/1988 | Spiesman et al. | 360/42 |
| 4,881,041 | 11/1989 | Kawanabe et al. | 328/112 |
| 4,992,874 | 2/1991 | Willis et al. | 358/183 |
| 5,021,788 | 6/1991 | Ueki et al. | 341/152 |
| 5,028,815 | 7/1991 | Van De Plassche | 307/355 |
| 5,057,702 | 10/1991 | Kitagawa et al. | 307/268 |
| 5,117,135 | 5/1992 | Lee et al. | 307/514 |
| 5,119,243 | 6/1992 | Shimazaki et al. | 360/46 |
| 5,148,168 | 9/1992 | Masuda et al. | 341/152 |
| 5,150,201 | 9/1992 | Mehrgardt et al. | 358/23 |
| 5,218,279 | 6/1993 | Takahashi et al. | 318/560 |

FOREIGN PATENT DOCUMENTS 0181952  5/1986  European Pat. Off. .

OTHER PUBLICATIONS

Sedra & Smith, Microelectronic Circuits, 3rd Edition Saunders College Publishing, Philadelphia 1991.

*Primary Examiner*—Timothy P. Callahan
*Assistant Examiner*—Jeffrey Zweizig
*Attorney, Agent, or Firm*—Robert H. Kelly; William J. Kubida; Holland & Hart

[57] ABSTRACT

A duty cycle control circuit, and an associated method, generates an output clock signal having a duty cycle which differs by a desired amount with the duty cycle of an input clock signal. Offset bias signal circuitry generates an offset bias signal which offsets a copy clock signal and an inverted copy clock signal relative to one another by a selected offset bias. The duty cycle of the output clock signal differs with the duty cycle of the input clock signal by an amount which is related to the amplitude of the offset bias signal.

14 Claims, 5 Drawing Sheets

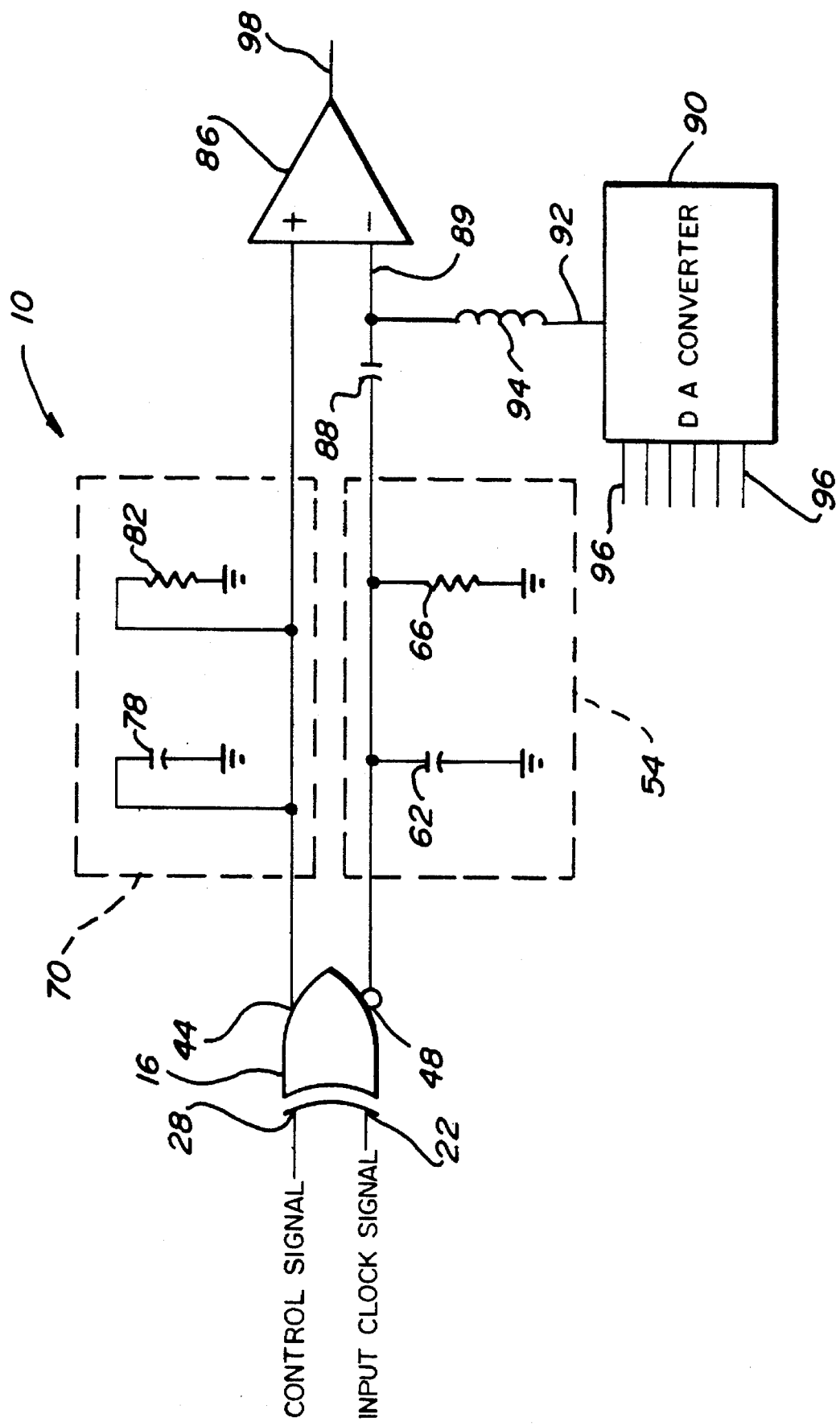
Fig_1

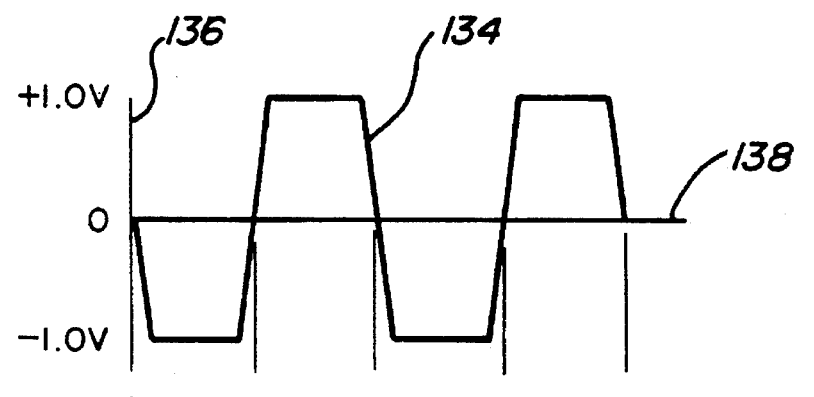
Fig_2A
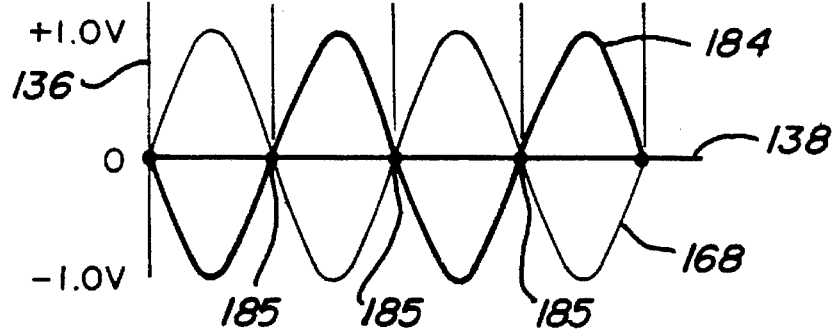
Fig_2B
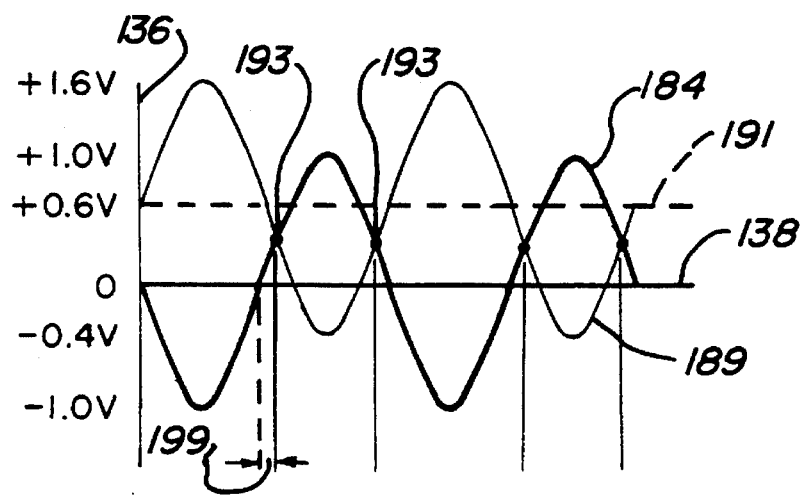
Fig_2C
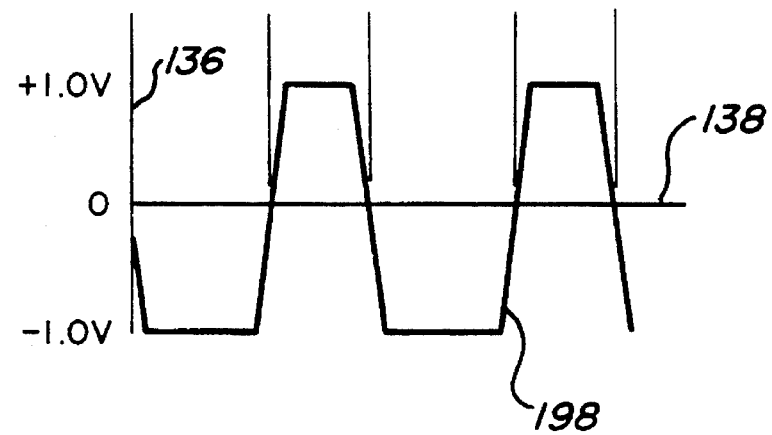
Fig_2D

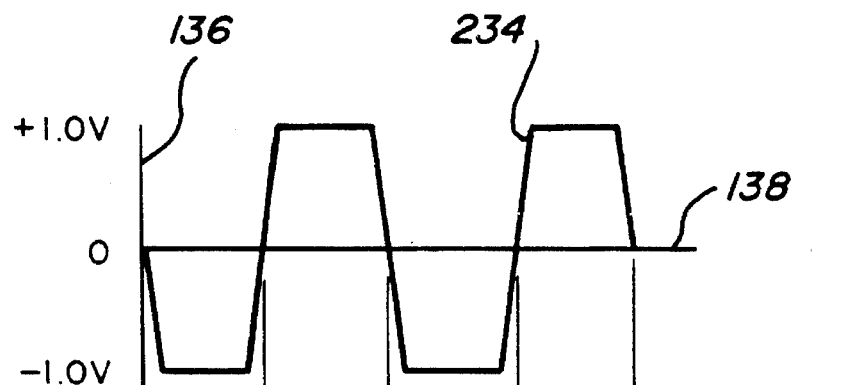
Fig_3A
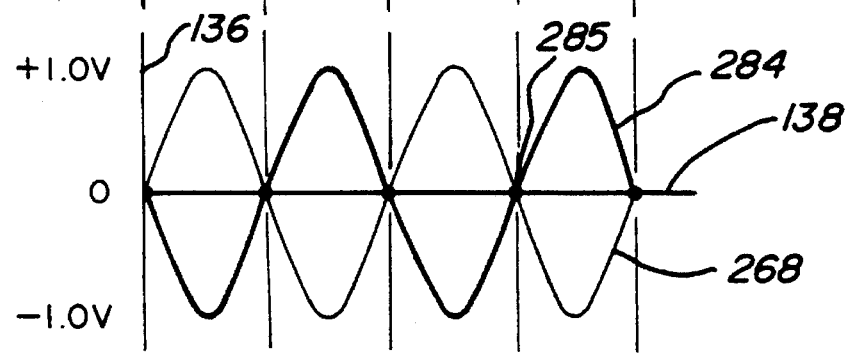
Fig_3B
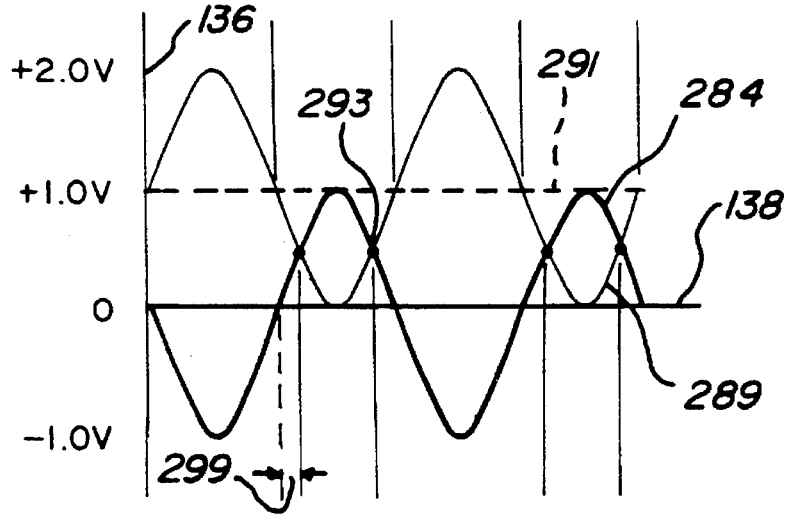
Fig_3C
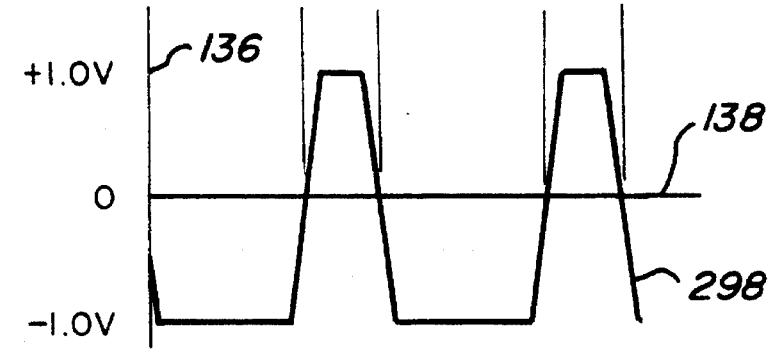
Fig_3D

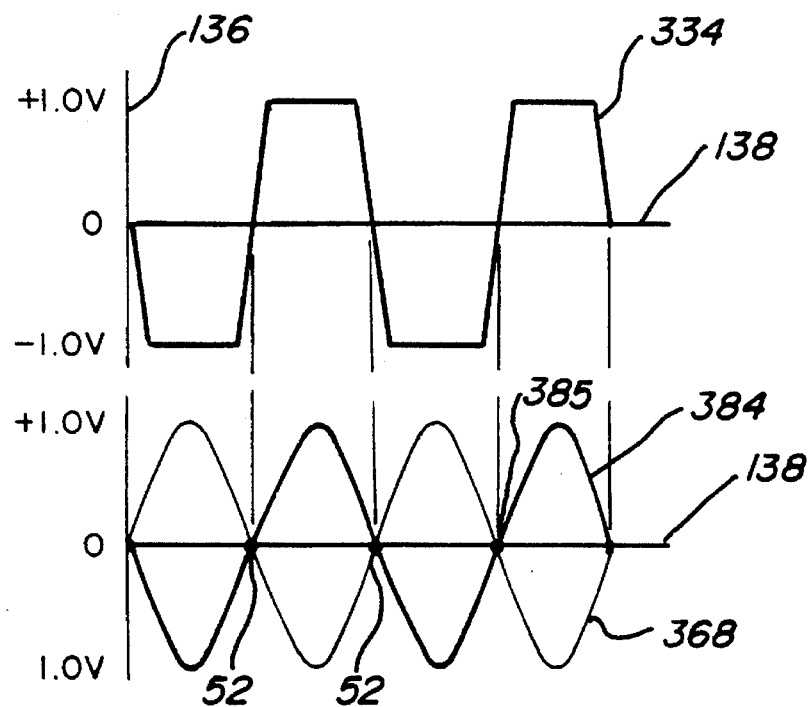
Fig. 4A
Fig. 4B
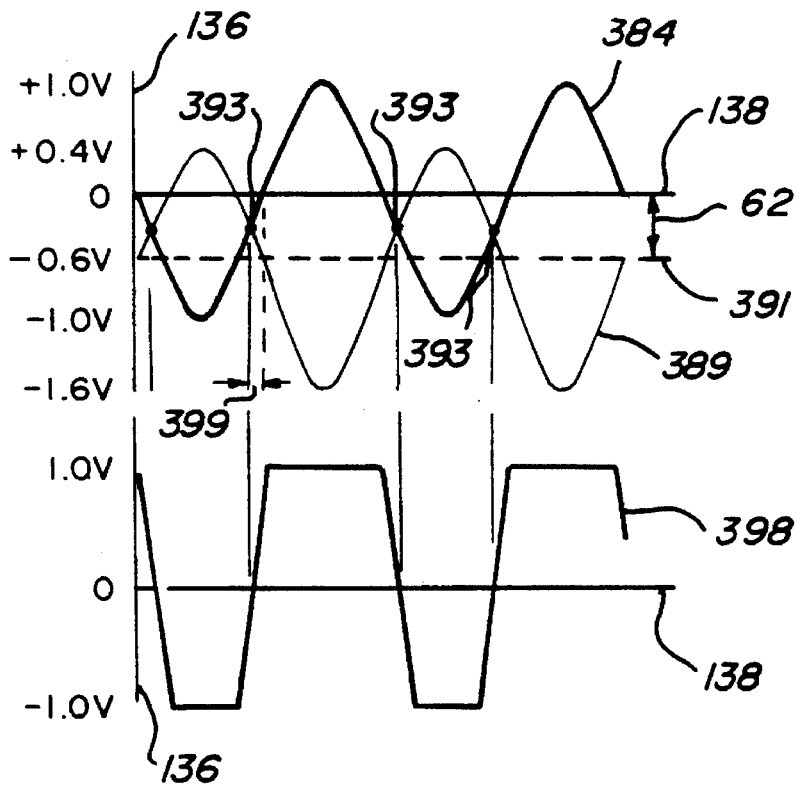
Fig. 4C
Fig. 4D

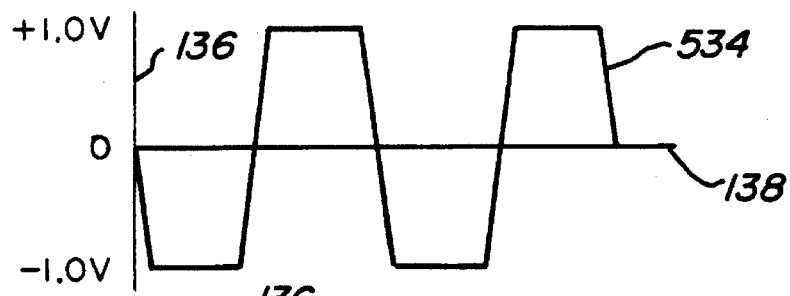
Fig_5A
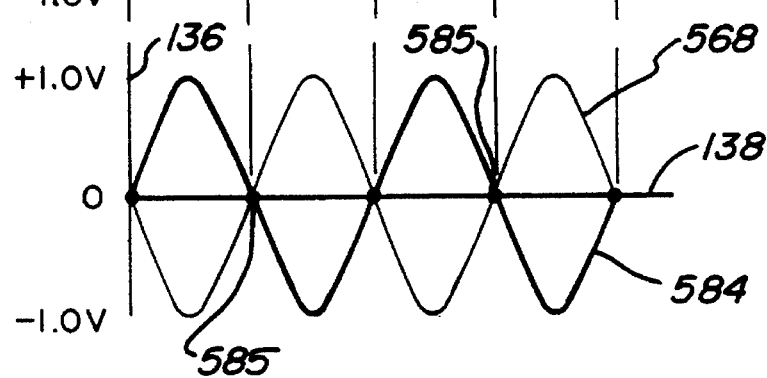
Fig_5B
Fig_5C
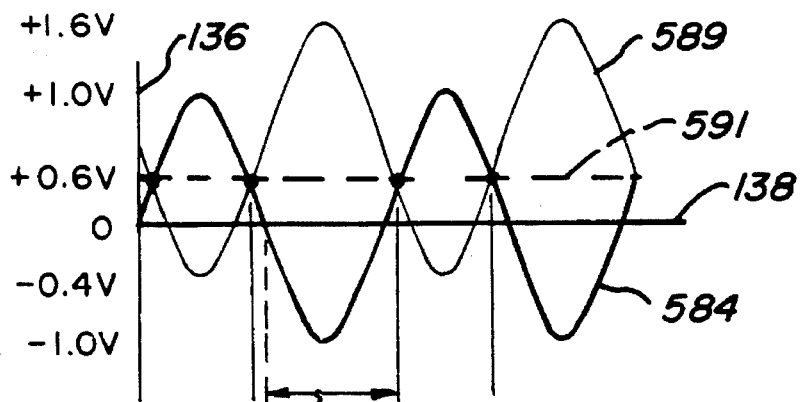
Fig_5D
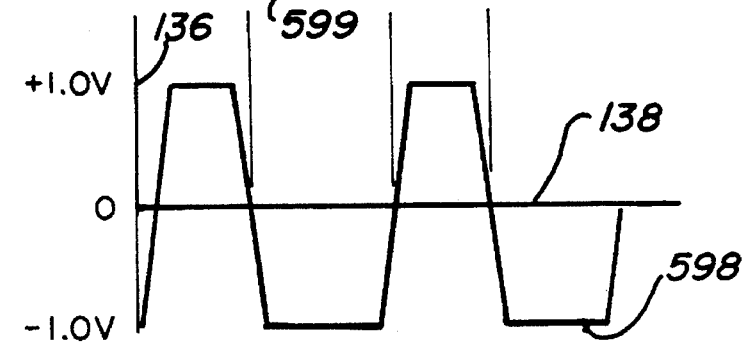
Fig_5E

DUTY CYCLE CONTROL CIRCUIT AND ASSOCIATED METHOD

The present invention relates generally to selectively adjusting the relative phase of two signals. More particularly, the present invention relates to a new and improved duty cycle control circuit, and an associated method, which generates a high frequency output signal having a duty cycle which differs with the duty cycle of an input high frequency signal wherein the duty cycle of the output signal is selectable and not related to or constrained by discrete time intervals.

BACKGROUND OF THE INVENTION

Many varied applications exist for techniques for controlling the duty cycles of periodic signals. In some applications, duty cycle control circuitry is required to form essential portions of electronic devices. In other applications, signals of selected duty cycles are utilized to test or evaluate electronic devices. When used for testing purposes, an input signal and an output signal generated by a duty cycle control circuit together form timing signals. The input signal is sometimes referred to as a clock or "stimulus" signal and the output signal is sometimes referred to as a "response" signal. Comparing the relative time of the clock and response signals, provides a basis for evaluating the functionality of the electronic device. Regardless of the application, however, the amount of difference between the input and output signal typically must be selectively and precisely controlled.

In most instances, the input signal is a periodic, clock type signal. Such signal shall hereinafter be referred to as an input clock signal, and the signal generated by the duty cycle circuitry shall be referred to as the output signal.

Conventional duty cycle control circuitry is operative to generate an output signal by introducing a signal delay upon an input clock signal. By generating a signal which is delayed in time relative to the input clock signal, the resultant signal is of a changed duty cycle relative to the input clock signal by an amount corresponding to the amount of signal delay introduced upon the input signal.

Utilizing conventional techniques, the signal delay is introduced upon the input signal by adding electronic gates to a circuit path formed through the circuitry. When the input signal is applied to the circuit path with the electronic gates added thereto, a signal delay is introduced upon the input signal which is of a signal delay amount corresponding to the number of electronic gates added to the circuit path. By increasing the number of electronic gates added to the circuit path, the amount of signal delay, and, hence, duty cycle change, of the signal applied to the circuit is increased.

Conventionally, the input signal is typically formed of a periodic, clock type signal. As the frequency of the input clock signal is increased, the amount of signal delay introduced upon the input signal by conventional circuitry is reduced from the desired amount. For instance, when the input clock signal is of a frequency of approximately one gigahertz, the period of the signal is approximately one nanosecond. A signal delay introduced upon the one gigahertz input clock signal must be on the order of a fractional portion of the one nanosecond period of the input clock signal to cause the resultant signal to be of a desired duty cycle change. At such high frequencies, however, the introduction of a signal delay through the addition of a single electronic gate to the circuit path of such circuitry can result in a signal delay which causes the duty cycle change of the resultant signal to be of a greater than desired amount. Conventional circuitry, which introduces a signal delay upon an input clock signal, is therefore inadequate when input clock signals are of such relatively high frequencies.

Additionally, such conventional circuitry is only operative to change the duty cycle of an input clock signal as a result of the signal delays, and the duty cycle change is permitted only to be of discrete amounts corresponding to signal delays introduced upon the input clock signal by the addition of integer numbers of electronic gates to the circuit path of the circuitry. Such circuitry cannot generate a signal which is changed by duty cycle changes of other than integer numbers of discrete gate delay amounts.

It is with respect to these considerations and other background information relative to duty cycle control circuitry that the significant improvements of the present invention have evolved.

SUMMARY OF THE INVENTION

The present invention advantageously provides a duty cycle control circuit, and an associated method, which generates an output signal, having a duty cycle changed relative to an input clock signal. An offset bias signal is provided to the duty cycle control circuit such that the output signal generated by the circuit is changed relative to the input clock signal by an amount proportional to the level of the offset bias signal. Because the duty cycle change is caused by the application of an offset bias signal rather than the use of electronic gates, the output signal may be of any desired duty cycle, including very small amounts of duty cycle change. Additionally, because the amount of the duty cycle change of the output signal is proportional to the level of the offset bias signal applied thereto, the amount of the duty cycle change is not limited to discrete levels of duty cycle change corresponding to signal delays introduced upon an input clock signal by the addition of an integer number of electronic gates added to a circuit path.

In accordance with these and other aspects, a new duty cycle control circuit, and an associated method, generates an output signal which is of a changed duty cycle relative to an input clock signal defined by an input clock frequency. Clock signal copying circuitry is coupled to receive the input clock signal. The clock signal copying circuitry generates a first copy clock signal of signal values inverted relative to values of the input clock signal and defined by a first copy clock signal frequency corresponding to the input clock frequency. Signal offset circuitry offsets a signal representative of the input clock signal and the first copy clock signal relative to one another by a selected offset bias signal. Difference determining circuitry is coupled to receive the signal representative of the input clock signal and the first copy clock signal, once offset relative to one another by the signal offset bias circuitry. The difference determining circuitry generates an output signal having values corresponding to differences between the signal representative of the input clock signal and the first copy clock signal, once offset relative to one another, whereby the output signal is of a duty cycle changed relative to the input clock signal by an amount related to the offset bias signal.

A more complete appreciation of the present invention and the scope thereof can be obtained from the accompanying drawings which are briefly summarized below, the following detailed description of the presently preferred embodiments of the invention, and the appended claims.

BRIEF DESCRIPTION OF THE DRAWINGS

FIG. 1 is a schematic illustration of a duty cycle control circuit embodying the present invention.

FIGS. 2A, 2B, 2C, and 2D are graphical representations of signals which illustrate an example of the operation of the duty cycle control circuit shown in FIG. 1, wherein FIG. 2A represents an input clock signal applied to the circuit shown in FIG. 1, FIGS. 2B and 2C represent signals generated during operation of the circuit shown in FIG. 1, and FIG. 2D represents an output signal generated by the circuit shown in FIG. 1.

FIGS. 3A, 3B, 3C and 3D are graphical representations of signals which illustrate another example of operation of the duty cycle control circuit shown in FIG. 1, similar to corresponding signals represented in FIGS. 2A–2D, wherein FIG. 3A represents an input clock signal applied to the circuit shown in FIG. 1, FIGS. 3B and 3C represent signals generated during operation of the circuit shown in FIG. 1, and FIG. 3D represents an output signal generated by the circuit shown in FIG. 1.

FIGS. 4A, 4B, 4C, and 4D are graphical representations which also illustrate another example of operation of the duty cycle control circuit shown in FIG. 1, similar to the graphical representations shown in FIGS. 2A–2D and FIGS. 3A–3D, wherein FIG. 4A represents an input clock signal applied to the circuit shown in FIG. 1, FIGS. 4B and 4C represent signals generated during operation of the circuit shown in FIG. 1, and FIG. 4D represents an output signal generated by the circuit shown in FIG. 1.

FIGS. 5A, 5B, 5C, 5D, and 5E are graphical representations of signals which also illustrate another example of operation of the duty cycle control circuit shown in FIG. 1, wherein FIG. 5A represents an input clock signal applied to the circuit shown in FIG. 1, FIGS. 5B, 5C, and 5D represent signals generated during operation of the circuit shown in FIG. 1, and FIG. 5E represents an output signal generated by the circuit shown in FIG. 1.

DETAILED DESCRIPTION

A presently preferred embodiment of a duty cycle control circuit, referred to generally by reference numeral 10, is illustrated in FIG. 1. The duty cycle control circuit 10 includes a logical exclusive-or gate 16 having a first input terminal 22 and a second input terminal 28. An input clock signal, in the form of a periodic, oscillating signal shown in FIG. 2A is applied to the first input terminal 22 of the gate 16. A control signal is applied to the second input terminal 28 of the gate 16. The gate 16 further includes a noninverting output 44 and an inverting output 48.

The exclusive-or gate 16 generates a signal at a noninverting output terminal 44 which is identical to the input clock signal applied to the first input terminal 22 when a control signal of a low logic level is applied to the second input terminal 28 of the gate 16. The gate 16 is operative to generate a signal at the inverting output terminal 48 which is inverted relative to the input clock signal applied to the first input terminal 22 when the control signal applied to the second input terminal 28 is of a low logic level.

When the control signal applied to the second input terminal 28 of the gate 16 is of a high logic level, the gate 16 is operative to generate a signal at the noninverting output terminal 44 which is inverted with respect to that of the input clock signal applied to the first input terminal 22 and to generate a signal at the inverting output terminal 48 which corresponds to the input clock signal applied to the first input terminal 22.

A first filter circuit 54, represented by the block shown in dash, is coupled to the inverting output terminal 48 of the gate 16. The first filter circuit 54 includes a capacitor 62 and a parallel connected resistor 66 which couple the inverting output terminal 48 to circuit ground.

A second filter circuit 70, represented by the block shown in dash in the figure, is coupled to the noninverting output terminal 44 of the gate 16. The second filter circuit 70 includes a capacitor 78 and a parallel connected resistor 82 which couple the noninverting output terminal 44 to circuit ground.

The first filter circuit 54 is operative to filter the inverted signal generated at the inverting output terminal 48 of the gate 16, and the second filter circuit 70 is operative to filter the signal generated at the noninverting output terminal 44 of the gate 16. More particularly, the capacitor 62 of the first filter circuit 54 is operative to remove the harmonic contents of signal edges of the signal generated at the inverting output terminal 48 of the gate 16. By removing the harmonic contents of the signal edges, the square wave generated at the output terminal 48 is converted into a sine wave. The resistor 66 of the first filter circuit 54 is operative to form a terminating resistor for properly terminating the signal generated at the inverting output terminal 48 of the gate 16, once the harmonic contents of the signal edges are removed by the capacitor 62. Similarly, the capacitor 78 of the second filter circuit 70 is operative to remove the harmonic contents of signal edges of the signal generated at the noninverting output terminal 44 of the gate 16, while the resistor 82 is also operative to form a terminating resistor for properly terminating the signal generated at the noninverting output terminal of the gate 16, once the harmonic contents of the signal edges are removed by the capacitor 78. By removing the harmonic contents of the signal edges, the square wave generated at the output terminal 44 is converted into a sine wave. While the first and second filter circuits 54 and 70 shown in FIG. 1 are simple, RC filter circuits, the filter circuits 54 and 70 may alternately comprise other types of filter circuits depending upon what filter characteristics are desired of the filter circuits. The filtered signals generated by the filter circuits 54 and 70 are sine waves which have slower rise and fall times relative to the rise and fall times of the leading and trailing edges of the square waves generated at the output terminals 44 and 48 of the gate 16.

The filtered signal on inverting output terminal 48 is applied on line 89 to a negative input of a differential amplifier 86 through a dc blocking capacitor 88. The filtered signal from the noninverting output terminal 44 of gate 16 is applied directly to a positive input of the differential amplifier 86.

A signal offset bias circuit, here a digital-to-analog converter 90, generates a dc signal which is summed together with the filtered signal on line 89. The dc signal is generated on line 92 by the converter 90 and is connected to line 89 through an ac blocking inductor 94. Because the capacitor 88 blocks dc signals (such as those generated by the converter 90) and because the inductor 94 blocks ac signals (such as those passed by the filter circuit 54), the signals passed by the filter circuit 54 and the converter 90 are summed together at line 89 and are applied to the negative input of the differential amplifier 86. This forms an offset bias voltage which biases the filtered signal passed by the first filter circuit 54. The signal generated on the line 92 is an analog signal of a value determined by digital input signals applied to the digital-to-analog converter 90 on lines 96. Other means of generating an analog (or other) dc signal for application to line 89 are also possible.

The differential amplifier 86 is operative to generate a signal on line 98 which is representative of the differences between the signals applied to the positive and negative inputs thereof. As previously described, the offset bias voltage comprising the dc signal generated on line 92 by the converter 90 is summed together with the ac signal passed by the filter circuit 54 and is coupled to the negative input of the differential amplifier 86. As a result, the differential amplifier 86 is then operative to determine the differences between the filtered signals passed by the second filter circuit 70 and the first filter circuit 54 (the latter as offset by the offset bias voltage) and to generate a signal indicative of such differences on line 98.

As mentioned previously, the input clock signal applied to the duty cycle control circuit 10 may be a very high frequency signal of one gigahertz or more. The duty cycle control circuit 10 shown in FIG. 1 is operable at such frequencies, and the input clock signal applied to the first input terminal 22 of the gate 16 may be of such a frequency. For purposes of the following description of operational examples of the duty cycle control circuit 10, the input clock signal shall be considered to be of a frequency of one gigahertz at +/– one volt (two volts peak-to-peak). The frequency and the amplitude of the input clock signal may, of course, be of other frequencies and amplitudes.

The graphical representation of FIG. 2A is a plot of the input clock signal, here referred to by the reference numeral 134, which is applied to the first input terminal 22 of the gate 16 of the duty cycle control circuit 10 shown in FIG. 1. The amplitude of the input clock signal 134 is plotted along the ordinate axis 136 as a function of voltage and along the abscissa axis 138 as a function of time. The graphical representations of FIGS. 2B–2D are plotted upon an axis system similarly defined by an ordinate axis 136 and an abscissa axis 138.

Signals 168 and 184 are illustrated in FIG. 2B. The signal 168 is representative of the signal passed by the first filter circuit 54, and the signal 184 is representative of the filtered signal passed by the second filter circuit 70. As the signals 168 and 184 are merely the signals generated at the noninverting and inverting output terminals 44 and 48 of the gate 16 (as filtered by the respective filter circuits 70 an 54) the plots 168 and 184 are identical to one another, but are 180 degrees out of phase relative to one another. The plots of the signals 168 and 184, however, are observed to intersect at a number of intersection points, referred to as crossover points 185, at midpoints between the maximum and minimum amplitudes of the signals 168 and 184.

The signal 184 is again illustrated in FIG. 2C. The signal 184 is, as previously described, applied to the positive input terminal of the differential amplifier 86 of the duty cycle control circuit 10. The plot of the signal 189 is representative of the signal applied to the negative input terminal of the amplifier 86 to which the offset bias signal generated by the converter 90 is summed. In the example shown in FIG. 2C, the signal 189 is formed of the filtered signal passed by the filter circuit 54 summed with a positive dc bias of 0.6 volts generated on line 92.

The positive dc bias of 0.6 volts offsets the signal 189 by 0.6 volts. Such offset is represented in the figure by a horizontal line 191 representing 0.6 volts. The plots of the signals 184 and 189 intersect at a number of crossover points 193 which, in contrast to the crossover points 185 shown in FIG. 2B, are offset relative to the abscissa axis 138. At the crossover points 193, the values of the signals 184 and 189 remain identical in value despite the offset.

FIG. 2D is a graphical representation of the output signal, here identified by the reference numeral 198, which is generated upon line 98 of the duty cycle control circuit 10 shown in FIG. 1. The output signal 198 is similar in shape to that of the clock signal 134 shown in FIG. 2A but is of a different duty cycle. The differential amplifier 86 shown in FIG. 1 generates the output signal 198 on line 98 in response to signal values which are representative of differences in the values at its positive and negative inputs. Accordingly, the crossover points 193 shown in FIG. 2C correspond to zero crossings of the output signal 198 shown in FIG. 2D.

The positive dc bias generated by the converter 90 of the duty cycle control circuit 10 shown in FIG. 1, and represented by the horizontal line 191 shown in FIG. 2C, alters the location of the zero crossings of the output signal 198. The positive dc bias of 0.6 volts causes an output signal 198 to differ relative to the clock signal 134 shown in FIG. 2A by an amount indicated at point 199. As a result, a duty cycle change is introduced upon the output signal 198 by an amount which is directly proportional to the offset bias supplied to the negative input terminal of the differential amplifier 86.

By varying the amount of the offset bias supplied to the negative input terminal of the differential amplifier 86, the amount of duty cycle change of the output signal 198 relative to the clock signal 134 may be varied. Because the amount of the duty cycle change is dependent upon the amount of the offset bias signal rather than prior art techniques which introduce a number of electronic gates in a circuit path to cause signal delay, a duty cycle change of an amount corresponding to a signal delay of a fractional portion of a single electronic gate may be introduced upon the output signal 198. Additionally, the amount of the duty cycle change can be of any desired amount and it is not limited to changes of amounts corresponding to integer multiples of signal delays introduced by the addition of a number of electronic gates into a circuit path.

FIGS. 3A–3D are graphical representations similar to the corresponding representations shown in FIGS. 2A–2D, but wherein the amount of signal offset bias applied to the negative input terminal of the differential amplifier 86 differs from that of the examples illustrated in FIGS. 2A–2D. The graphical representations of FIGS. 3A–3D are also plotted upon axis systems similarly defined by an ordinate axis 136 and an abscissa axis 138.

The graphical representation of FIG. 3A illustrates an input clock signal, here referred to by the reference numeral 234, but which corresponds in amplitude, phase, and frequency with the clock signal 134 illustrated in FIG. 2A.

The graphical representation shown in FIG. 3B corresponds to the graphical representation shown in FIG. 2B with the signal 268 corresponding to the signal 168 shown in FIG. 2B and being representative of the filtered signal passed by the first filter circuit 54. The signal 284 corresponds to the signal 184 shown in FIG. 2B and is representative of the filtered signal passed by the second filter circuit 70 of the duty cycle control circuit 10 shown in FIG. 1. Crossover points 285 are formed at the intersections between the plots of signals 268 and 284. As the signals 268 and 284 are identical to one another, but are 180 degrees out of phase with one another, the crossover points 285 are formed along the abscissa axis 138 at locations corresponding to the zero crossings of the clock signal 234.

The signal 284 is again illustrated in FIG. 3C. A signal 289 is also illustrated in FIG. 3C and is representative of the signal applied to the positive input terminal of the amplifier 86. The signal applied to the negative input of the amplifier 86 is, again, the filtered signal passed by the filter circuit 54 to which the offset bias signal generated by the converter 90 is summed. In the example shown in FIG. 3C, the signal 289 is formed of the filtered signal passed by the filter circuit 54 summed with a positive dc bias of 1.0 volts.

The positive dc bias of 1.0 volts offsets the plot 289 by 1.0 volts. Such offset is represented by a horizontal line 291 representing 1.0 volts. The signals 284 and 289 then intersect at crossover points 293 which are offset from the abscissa axis 138. Comparison of the crossover points 293 shown in FIG. 3C and the crossover points 193 shown in FIG. 2C illustrates that an increase in the magnitude of the offset bias signal causes a rightward shifting of the crossover points 293 relative to that of the corresponding crossover points 193 shown in FIG. 2C.

FIG. 3D represents an output signal 298 generated by the differential amplifier 86 of the duty cycle control circuit 10 shown in FIG. 1 responsive to the signals 284 and 289 shown in FIG. 3C. The amount of the duty cycle change caused by the offset bias signal is indicated at point 299. Because the offset bias signal applied to the negative input of the differential amplifier 86 is greater in the example of FIG. 3C than the corresponding offset bias signal in the example FIG. 2C, the amount of duty cycle change of the output signal 298 relative to the clock signal 234 is, in turn, greater than the relative duty cycle change between signals 198 and 134 shown in FIGS. 2D and 2A. Accordingly, comparison of the signals 298 and 198 indicates that increasing the offset bias signal causes an increase in the duty cycle change of the output signal generated by the duty cycle control circuit 10.

FIGS. 4A–4D are graphical representations similar to corresponding representations shown FIGS. 2A–2D and FIGS. 3A–3D, but wherein the amount of offset bias signal differs from those of the examples illustrated in FIGS. 2A–2D and 3A–3D. The graphical representations of FIGS. 4A–4D are also plotted upon axis systems defined by an ordinate axis 136 and an abscissa axis 138.

The graphical representation of FIG. 4A illustrates an input clock signal, here identified by reference numeral 334, but which corresponds in amplitude, phase, and frequency with the clock signals 134 and 234 illustrated in FIGS. 2A and 3A.

The graphical representations shown in FIG. 4B correspond to the graphical representations shown in FIGS. 2B and 3B. The signal 368 corresponds to the signals 168 and 268 shown in FIGS. 2B and 3B, and is also representative of the filtered signal passed by the first filter circuit 54. The signal 384 corresponds to the signals 184 and 284 shown in FIGS. 2B and 3B, and is representative of the filtered signal generated by the second filter circuit 70 of the duty cycle control circuit 10 shown in FIG. 1. Crossover points 385 are formed at the intersections between the plots of the signals 368 and 384. As the signals 368 and 384 are identical to one another, but are 180 degrees out of phase with one another, the crossover points 385 are formed along the abscissa axis 138 at locations corresponding to the zero crossings of the clock signal 334. The signal 384 is again illustrated in FIG. 4C and is representative of the signal applied to the positive input terminal of the amplifier 86. The signal applied to the negative input terminal of the amplifier 86 is the filtered signal passed by the filter circuit 54 to which the offset bias signal generated by the converter 90 is summed. In the example shown in FIG. 4C, the signal 389 is formed of the filtered signal passed by the filter circuit 54 summed with a negative dc bias of 0.6 volts.

The negative dc bias of the 0.6 volts offsets the plot 389 by 0.6 volts. Such offset is represented in the figure by a horizontal line 391 representative of 0.6 volts. The signals 384 and 389 intersect at crossover points 393 which are offset from the abscissa axis 138. Comparison of the crossover points 393 shown in FIG. 4C with the cross over points 193 and 293 shown in FIGS. 2C and 3C illustrate that a negative offset bias signal causes a leftward shifting of the crossover points 393 relative to the corresponding cross over points 193 and 293 shown in FIGS. 2C and 3C.

The graphical representation of FIG. 4D represents an output signal 398 responsive to the signals 384 and 389 shown in FIG. 4C. The amount of change of the duty cycle caused by the offset bias signal of 0.6 volts is indicated at point 399. Because the offset bias signal in the example of FIG. 4C is a negative value, while the offset signal biases summed with the filtered signals and applied to an input of the differential amplifier 86 in the examples of FIGS. 2C and 3C are positive values, the amount of duty cycle change of the output signal 398 relative to the clock signal 334 differ with the amounts of duty cycle change of the output signals 198 and 298 of FIGS. 2D and 3D. As can be seen, the application of a negative offset bias signal causes the output signal generated by the duty cycle control circuit 10 to be of a reduced duty cycle. Accordingly, comparison of the signal 398 with the signals 298 and 198 indicates that by generating a negative offset bias signal and applying it to the amplifier 86 causes a reduction in the duty cycle of the output signal generated by the duty cycle control circuit 10.

FIGS. 5A–5E are graphical representations which illustrate another operating example of the duty cycle control circuit 10 shown in FIG. 1. In the example of operation illustrated in FIGS. 5A–5E, formation of an output signal in response to a control signal as applied to the second input 28 of the gate 16 is illustrated. The graphical representations of FIGS. 5A–5E are also plotted upon axis systems defined by an ordinate axis 136 and an abscissa axis 138.

The graphical representation of FIG. 5A illustrates an input clock signal, here identified by the reference numeral 534, which corresponds in amplitude, phase, and frequency with the clock signals 134, 234, and 334 illustrated in FIGS. 2A, 3A, and 4A, respectively.

The graphical representation of FIG. 5B represents the signal, referred to generally by reference numeral 544, generated at the noninverting output terminal 44 of the gate 16 shown in FIG. 1 when the control signal applied to the second input terminal 28 is of a high logic level. The signal 544 is of an inverted signal value with respect to the corresponding signal value of the input clock signal 534. Hence, while the frequency of the signal 544 corresponds with the frequency of the signal 534, the signal 544 is 180 degrees out of phase with the input clock signal 534. Application of a control signal of a high logic level to the second input terminal 28 of gate 16 therefore causes a 180 degree phase shift of the input clock signal 534 applied to the first input terminal 22.

The graphical representation of FIG. 5C corresponds to the graphical representations shown in FIGS. 2B, 3B and 4B. The plot 568 is representative of the filtered signal passed by the first filter circuit 54 shown in FIG. 1. The plot 584 is representative of the filtered signal passed by the second filter circuit 70. As the signal 544 generated at the output terminal 44 of the gate 16 is 180 degrees out of phase relative to the input clock signal 534 applied to the first input terminal 22, the signal 584 is similarly 180 degrees out of phase relative to the corresponding signals 184, 284 and 384 of FIGS. 2B, 3B, and 4C. For similar reasons, the signal 568 is also 180 degrees out of phase relative to the corresponding plots of signals 168, 268, and 368 of FIGS. 2B, 3B, and 4B. Crossover points 585 are formed at the intersections between the plots of signals 568 and 584. As the plots of signals 568 and 584 are identical to one another, but 180 degrees out of phase with respect to one another, the crossover points 585 are formed along the abscissa axis 138 at locations corresponding to the zero crossings of the signal 544 and the input signal 534.

The graphical representation of FIG. 5D illustrates the signals which are applied to the inputs of the differential amplifier 86 of the duty cycle control circuit 10. The signal 584, passed by the second filter circuit 70 and also illustrated in FIG. 5C, is applied to the positive input terminal of the differential amplifier 86. The signal 589 is applied to the negative input terminal of the amplifier 86 and is formed of the signal 568 summed together with an offset bias signal. The offset bias signal applied to the signal 568 in the example shown in FIG. 5D is a positive 0.6 volts. Such offset is represented in the figure by a horizontal line 591 shown in dash. Crossover points 593 are indicated in the figure at intersections between the plots of signals 584 and 589.

The graphical representation of FIG. 5E represents an output signal 598 generated by the differential amplifier 86 of the duty cycle control circuit 10 shown in FIG. 1 responsive to the application of signals 584 and 589 shown in FIG. 5D. Because application of a high logic level control signal to the input terminal 28 of the gate 16 inverts the signals generated at the outputs of the gate, the output signal 598 is altered not only due to the offset bias signal but also due to the application of the high logic level control signal. The amount of the change of the duty cycle of the output signal 598 relative to the input clock signal 534 is indicated at point 599.

The examples shown in the preceding figure illustrate the change in the duty cycle which is caused by the application of an offset bias signal summed to a signal applied to the amplifier 86. While the offset bias signal generated by the converter 90 shown in FIG. 1 is applied to the signal generated at the inverting output terminal 48 of the gate 16 (as filtered by the first filter circuit 54) the offset bias signal may alternately be applied to the signal generated at the output of the noninverting output 44 of the gate 16 to cause similar changes of duty cycle of the output signal generated on line 98 by the amplifier 86. Offset bias signals of dissimilar values could, of course, also be summed together with the signals generated at both the noninverting output and the inverting output terminals 44 and 48 of the gate 16 to generate an output signal.

The duty cycle control circuit 10 advantageously provides an output signal which is of a desired duty cycle. The duty cycle control circuit 10 is operative to provide an output signal of a duty cycle which is linearly related to the level of an offset bias signal applied to the circuit over a wide range of duty cycles. That is to say, when an offset bias signal is summed together with a signal which is applied to an input of the amplifier 86, changes in the amount of the offset bias signal cause a linear change in the duty cycle of the output signal generated by the duty cycle control circuit 10. Examination of the operation of the duty cycle control circuit 10 shows substantial linearity between the offset bias signal and the duty cycle of the output signal over a range of approximately 106 degrees (extending between negative fifty-three degrees and positive fifty-three degrees) when an input clock signal is of an amplitude of either +/− 1.0 volt. Moreover, when a high logic level control signal is applied to the input terminal 28 of the gate 16, an additional range of substantial linearity between the offset bias signal and the duty cycle of the output signal exists for another 106 degree range located 180 degrees out of phase with the first 106 degree range (extending between 127 degrees and 233 degrees). The duty cycle control circuit 10 is thereby operative to generate an output signal in which a linear relationship exists between the level of the offset bias signal and the duty cycle of the output signal over a range of 212 degrees.

As the output signal generated by the duty cycle control circuit 10 is formed by oppositely sloped signals applied to the differential amplifier 86, changes in the duty cycle of the output signal is little affected by noise.

The duty cycle control circuit, and the associated method, of the present invention is operative to generate an output signal which is of any desired duty cycle. Because the duty cycle is related to an offset bias signal rather than a signal delay introduced as a result of adding electronic gates to a circuit path, the change of the duty cycle is not limited to discrete integral amounts. Additionally, the circuit and method of the present invention generates an output signal in which the duty cycle of the output signal varies linearly with the level of offset bias signal over a wide range of duty cycles. The duty cycle of the output signal generated during operation of the present invention is therefore not only selectable over a large range, but a linear relationship exists between the level of the offset bias signal applied to the circuit and the duty cycle of the output signal.

Presently preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. A method for generating an output clock signal having a selected duty cycle responsive to an input clock signal having an input-signal duty cycle, said method comprising the steps of:

generating a control signal of either a first signal value or a second signal value;

generating a first copy clock signal of signal values inverted relative to values of the input clock signal when the control signal is of the first signal value and of signal values corresponding to values of the input clock signal when the control signal is of the second signal value;

generating a second copy clock signal of signal values corresponding to values of the input clock signal when the control signal is of the first signal value and of signal values inverted relative to values of the input clock signal when the control signal is of the second signal value;

offsetting the first copy clock signal and the second copy clock signal relative to one another by a selected bias voltage;

determining differences between the first copy clock signal and the second copy clock signal once offset from one another during said step of offsetting;

generating the output clock signal of signal values corresponding to differences determined during said step of determining; and whereby the duty cycle of the output clock differs with the input-signal duty cycle of the input clock signal by an amount related to the selected bias voltage which offsets the first copy clock signal and the second copy clock signal relative to one another during said step of offsetting.

2. The method of claim 1 wherein the control signal generated during said step of generating the control signal is applied to an input of a logical exclusive-or gate and the first copy clock signal generated during said step of generating the first copy clock signal is generated at an output of the logical exclusive-or gate.

3. A duty cycle control circuit for generating an output clock signal having a selected duty cycle responsive to an input clock signal having an input-signal duty cycle, said duty cycle control circuit comprising:

a logical exclusive-or gate having a first input coupled to receive the input clock signal and a second input coupled to receive a control signal, said logical exclusive-or gate having an inverting output for generating a first copy clock signal and a noninverting output for generating a second copy clock signal, said first copy clock signal and said second copy clock signal maintained in time synchronization and in an inverted phase relationship with one another, and the control signal, when of a high logic level and applied to the second input of said logical exclusive-or gate, for reversing signal values of the first copy clock signal and the second copy clock signal;

offset bias signal circuitry for offsetting the first copy clock signal and the second copy clock signal relative to one another by a selected offset bias signal;

difference determining circuitry coupled to receive the first copy clock signal and the second copy clock signal once offset relative to one another by the offset bias signal circuitry, said difference determining circuitry for generating the output clock signal of signal values corresponding to differences between the first copy clock signal and the second copy clock signal once offset relative to one another; and whereby the duty cycle of the output clock signal differs with input-signal duty cycle of the input clock signal by an amount related to the selected offset bias signal by which the offset bias signal circuitry offsets the first copy clock signal and the second copy clock signal relative to one another.

4. The duty cycle control circuit of claim 3 wherein the control signal applied to the second input of the logical exclusive-or gate is selectively of either a first signal level to cause the duty cycle of the output clock signal generated by the difference determining circuitry to be within a first range of duty cycles or a second signal level to cause the duty cycle of the output clock signal generated by the difference determining circuitry to be of duty cycles within a second range of duty cycles.

5. The duty cycle control circuit of claim 3 wherein the offset bias signal circuitry offsets the first copy clock signal generated by the logical exclusive-or gate by the selected bias signal, thereby to offset the first copy clock signal relative to the second copy clock signal.

6. The duty cycle control circuit of claim 3 further comprising first filter circuitry positioned in line between the logical exclusive-or gate and the difference determining circuitry to receive thereby the first copy clock signal generated by the logical exclusive-or gate, said first filter circuitry for filtering the first copy clock signal and for applying the first copy clock signal, once filtered thereat, to the difference determining circuitry.

7. The duty cycle control circuit of claim 3 further comprising second filter circuitry coupled to receive the second copy clock signal, said second filter circuitry for filtering the second copy clock signal and for applying the second copy clock signal, once filtered thereat, to the difference determining circuitry.

8. The duty cycle control circuit of claim 3 wherein the selected duty cycle of the output clock signal generated by the difference determining circuitry differs with the input-signal duty cycle of the input clock signal by an amount proportional to the selected offset signal bias by which the offset bias signal circuitry offsets the first copy clock signal and the second copy clock signal relative to one another.

9. A duty cycle control circuit for generating an output clock signal having a selected duty cycle responsive to an input clock signal having an input-signal duty cycle, said duty cycle control circuit comprising:

clock signal copying circuitry coupled to receive the input clock signal, said clock signal copying circuitry for generating a first copy clock signal of signal values inverted relative to values of the input clock signal and a second copy clock signal of values generally corresponding to values of the input clock signal, said first copy clock signal and said second copy clock signal maintained in time synchronization and in an inverted phase relationship with one another;

a digital-to-analog converter coupled to receive digital input signals and operative to generate an analog output signal forming an offset bias signal, the offset bias signal generated by said digital-to-analog converter for offsetting the first copy clock signal and the second copy clock signal relative to one another;

difference determining circuitry coupled to receive the first copy clock signal and the second copy clock signal once offset relative to one another by the offset bias signal generated by said digital-to-analog converter, said difference determining circuitry for generating the output clock signal of signal values corresponding to differences between the first copy clock signal and the second copy clock signal once offset relative to one another; and whereby the duty cycle of the output clock signal differs with input-signal duty cycle of the input clock signal by an amount related to the offset bias signal generated by said digital-to-analog converter to offset the first copy clock signal and the second copy clock signal relative to one another.

10. A duty cycle control circuit for generating an output clock signal having a selected duty cycle responsive to an input clock signal having an input-signal duty cycle, said duty cycle control circuit comprising:

clock signal copying circuitry coupled to receive the input clock signal, said clock signal copying circuitry for generating a first copy clock signal of signal values inverted relative to values of the input clock signal and a second copy clock signal of values generally corresponding to values of the input clock signal, said first copy clock signal and said second copy clock signal maintained in time synchronization and in an inverted phase with one another;

offset bias signal circuitry for offsetting the first copy clock signal and the second copy clock signal relative to one another by a selected offset bias signal;

ac blocking circuitry having a first side and a second side, the first side of said ac blocking circuitry coupled to receive the selected offset bias signal generated by said offset bias signal circuitry;

a differential amplifier having a first input coupled to receive the first copy clock signal and coupled to the second side of the ac blocking circuitry to receive the selected offset bias signal generated by the offset bias signal circuitry and a second input coupled to receive the second copy clock signal, said differential amplifier for generating the output clock signal of signal values corresponding to differences between the first copy clock signal and the second copy clock signal once offset relative to one another; and whereby the duty cycle of the output clock signal differs with input-signal duty cycle of the input clock signal by an amount related to the selected offset bias signal by which the offset bias signal circuitry offsets the first copy clock signal and the second copy clock signal relative to one another.

11. The duty cycle control circuit of claim 10 further comprising dc blocking circuitry positioned between the clock signal copying circuitry and the first input of the differential amplifier.

12. A method for generating an output clock signal having a selected duty cycle responsive to an input clock signal having an input-signal duty cycle, said method comprising the steps of:

applying the input clock signal to a first input of a logical exclusive-or gate;

applying a control signal to a second input of the logical exclusive-or gate;

generating a first copy clock signal of signal values inverted relative to values of the input clock signal at an inverting output of the logical exclusive-or gate;

generating a second copy clock signal of values generally corresponding to values of the input clock signal at a noninverting output of the logical exclusive-or gate, the first copy clock signal and the second copy clock signal maintained in time synchronization and in an inverted phase relationship with one another;

offsetting the first copy clock signal and the second copy clock signal generated during said steps of generating the first and second copy clock signals, respectively, relative to one another by a selected offset bias signal;

determining differences between the first copy clock signal and the second copy clock signal once offset from one another during said step of offsetting;

generating the output clock signal of signal values corresponding to differences determined during said step of determining; and whereby the output clock signal differs with the input-signal duty cycle of the input clock signal by an amount related to the selected offset bias signal which offsets the first copy clock signal and the second copy clock signal from one another.

13. The method of claim 12 wherein said step of offsetting comprises the step of applying the selected offset bias signal to the first copy clock signal, thereby to offset the first copy clock signal relative to the second copy clock signal.

14. The method of claim 12 wherein the output clock signal generated during said step of generating the output clock signal differs with the input-signal duty cycle of the input clock signal by an amount proportional to the selected offset bias signal which offsets the first copy clock signal and the second copy clock signal relative to one another.

* * * * *